US006323045B1

(12) United States Patent
Cline et al.

(10) Patent No.: US 6,323,045 B1
(45) Date of Patent: Nov. 27, 2001

(54) METHOD AND STRUCTURE FOR TOP-TO-BOTTOM I/O NETS REPAIR IN A THIN FILM TRANSFER AND JOIN PROCESS

(75) Inventors: Christopher Cline, Hopewell Junction; Nancy W. Hannon; Chandrika Prasad, both of Wappingers Falls; Thomas A. Wassick, Lagrangeville; Roy Yu, Poughkeepsie, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/456,590

(22) Filed: Dec. 8, 1999

(51) Int. Cl.[7] ............................ G01R 31/26; H01L 21/66; H01L 21/44; H01L 23/58; H01L 23/48

(52) U.S. Cl. ............................... 438/4; 438/15; 438/16; 438/17; 438/108; 438/613; 438/FOR 434; 438/FOR 343; 438/FOR 142; 228/180.22; 257/48; 257/737; 257/738; 257/778

(58) Field of Search ..................... 438/4, 15, FOR 434, 438/108, 613, FOR 343, 16, 17, FOR 142; 257/778, 737, 738, 48; 228/180, 22

(56) References Cited

U.S. PATENT DOCUMENTS

| | | |
|---|---|---|
| 4,304,450 | 12/1981 | Bilsback et al. . |
| 4,453,176 | 6/1984 | Chance et al. . |
| 4,817,850 | 4/1989 | Wiener-Avnear et al. . |
| 4,894,708 | 1/1990 | Watari . |
| 5,299,160 | 3/1994 | Mori . |
| 5,493,076 | 2/1996 | Levite et al. . |
| 5,532,853 | 7/1996 | Song et al. . |
| 5,725,995 | 3/1998 | Leedy . |
| 5,841,193 | 11/1998 | Eichelberger . |
| 5,895,230 | * 4/1999 | Bartley . |
| 6,159,657 | * 12/2000 | Eichelberger . |

* cited by examiner

Primary Examiner—David E. Graybill
(74) Attorney, Agent, or Firm—Ira D. Blecker

(57) ABSTRACT

A method and structure for providing top-to-bottom repair of a defective I/O net in a thin film transfer and join process. At least one C4 location and at least one capture pad are provided on a thin film substrate. The substrate is preferably ceramic. The C4 location of the defective net is severed by removal of a delete strap. The corresponding solder connection of the associated capture pad is also removed. A spare C4 location and capture pad are connected to provide a Z-repair line imbedded in the TF wiring structure. The Z-repair line is wired to the defective net.

16 Claims, 3 Drawing Sheets

METHOD AND STRUCTURE FOR TOP-TO-BOTTOM I/O NETS REPAIR IN A THIN FILM TRANSFER AND JOIN PROCESS

FIELD OF THE INVENTION

The present invention generally relates to repair of defective wiring connections in thin film multi-chip modules or chip carriers, and, more particularly, to the repair of thin film wiring using embedded metallurgy (TSM) repair schemes.

BACKGROUND OF THE INVENTION

The repair of thin film wiring using TSM (Top Surface Metal) repair lines is well known. In the conventional repair process, a defective electrical wiring net, used to connect components on a multichip carrier, is disconnected from its internal wiring through specialized delete locations located at the "C4" (Controlled-Collapsed-Chip-Connection) joining, pads. The net is reconstructed with equivalent electrical performance by connecting the X-Y grid of the repair lines on the top surface to the required C4 pads, matching the timing of the original net.

The reconstruction of the net is normally accomplished by joining the segments of the surface repair lines with individual gold ribbons bonded to the TSM repair lines through a lasersonic bonding methodology. The gold ribbons interconnect specific X and Y repair line segments to rebuild the net topography. FIG. 1 illustrates a portion of a conventional multi-chip module (MCM) before repair. In FIG. 1, C4 connection 10 is connected to net 12 at via 14. X repair line 16 and Y repair lines 18, 20 are part of the top layer. Y repair lines 18, 20 are connected by Y repair line subway 22 using vias 24, 26. Vias 14, 25, 26 connect to down levels. C4 connection 10 has a repair elbow 28 and a bond site 30.

FIG. 2 is a plan view of the portion of the device shown in FIG. 1 after the conventional repair process. (FIG. 3 is a cross-sectional view taken along the line 3—3 of FIG. 2.) When a defect is found in net 12, it is completely disconnected from the circuit using external delete 32 between C4 connection 10 and via 14. This process is repeated at every other C4 connection location for net 12. To replace this deleted net, a portion of X repair line 16 and Y repair lines 18, 20 must be used. Conventionally, X repair line 16 and Y repair lines 18, 20 are cut using deletes. Then, C4 connection 10 is connected to X repair line 16 using gold ribbon 34, and X repair line 16 is connected to Y repair line 20 using gold ribbon 36.

In a multi-layer thin film structure, most of the top-to-top wiring nets, which connect chip C4 through the thin film layers structure, can be repaired via top surface repair lines. For top-to-bottom nets, which connect C4 to peripheral I/O, however, there is no established repair methodology. Presently, all I/O repairs are made on a case by case basis, and partial repair and sacrificial repair methods have been employed for some special and simple I/O defects situations. A direct I/O plate-up repair method is a general repair approach, however, the current TF designs do not contain the needed repair features connecting capture pads (C/P) to C4 pads. The I/O repairability is also a slow and elaborate task, and does not have the manufacturability required for a production line.

A multilayer thin film module is typically processed on the surface of a MLC (Multi-Level Ceramic) carrier. After the structure is built, a full after-thin-film test is performed to confirm the integrity of the thin film structure. At this stage, if a defect is found to be associated with a top-to-bottom I/O net, then the part is in general considered unrepairable and will be rejected. There are some special situations when an I/O defect can be repaired by employing the concept and technique of graphical assisted partial repair. In general, however, there is no systematically established method to repair top-to-bottom I/O nets. The reason for the unrepairability in I/O nets is simply the inaccessibility of the top-to-bottom portion of I/O nets in the thin film on ceramic carrier design structure.

In a typical TF wiring design, about 30% of the capture pads (C/P) and 50% of the C4 (chip joining sites) are not used. Currently, these unused pads are only filled in by design and have no functionality.

In view of the shortcomings of the prior art, a reliable TF processing alternative is needed to improve the top-to-bottom repair process of thin film products.

SUMMARY OF THE INVENTION

To meet this and other needs, the present invention is directed to a device repair process that uses unused capture pads for top-to-bottom I/O repair. Since there are a substantial number of C4 and C/P that are not normally used, they can be paired up to form connections from the capture pads at the bottom of the thin film, to the C4's at the top of the thin films. In this way, the C/P-C4 pairing forms z-repair lines in the thin film structure by forming alternative passages from the capture pad to the C4.

Of the many unique features of thin film transfer-joining (TFTJ) technology, one of them is top-to-bottom I/O repairability. This z-repair line concept is the foundation for I/O repairability of TF in a TFTJ process. If an I/O net is found defective in the thin film wiring prior to joining to the ceramic carrier, the corresponding capture pad on the ceramic top surface is rewired to a nearby z-repair line site. The connection from the substrate to the capture pad of the defective I/O net is disconnected by means of via blocking or solder ball removal. Since the z-repair line will give the I/O an alternative path to the thin film top surface, a repair of a defective I/O net can be made. The original defective thin film portion of the I/O net is disconnected on the top surface from the C4 by standard laser delete and then wired to the TSM z-repair feature using conventional repair methodologies. In this way, the I/O net can be repaired via the z-repair lines embedded in the TF structure as part of the design. The solder joining between the ceramic and thin film on the repaired I/O site is preferably removed to eliminate the antenna effect on the remaining TF net.

The key features of this invention are the creation of alternative wiring paths between C4's and the bottom surface of the thin film portion of the structure (spare vertical connections), the creation of a simple wiring pattern of X and Y lines on the surface of the ceramic substrate to which the thin film transfer will be mated, and a method to remove or block the solder ball connection from the defective net during joining of the thin film to the ceramic using the solder lamination process.

These and other features and advantages of the invention will become apparent to those skilled in the art upon a review of the following detailed description of the presently preferred embodiments of the invention, viewed in conjunction with the appended drawings.

BRIEF DESCRIPTION OF THE DRAWINGS

FIG. 4 is an illustration of a TFTJ on ceramic, where

DETAILED DESCRIPTION OF THE PRESENTLY PREFERRED EMBODIMENTS OF THE INVENTION

Figure 1:
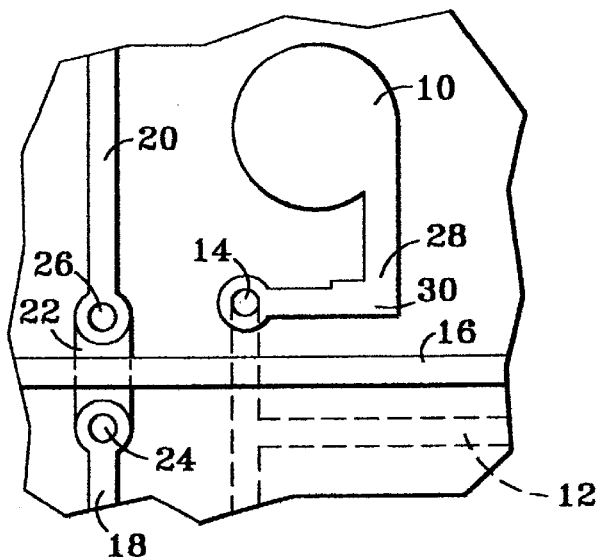
FIG. 1 is a plan view of a portion of a prior art multi-chip module (MCM) before repair.
Figure 2:
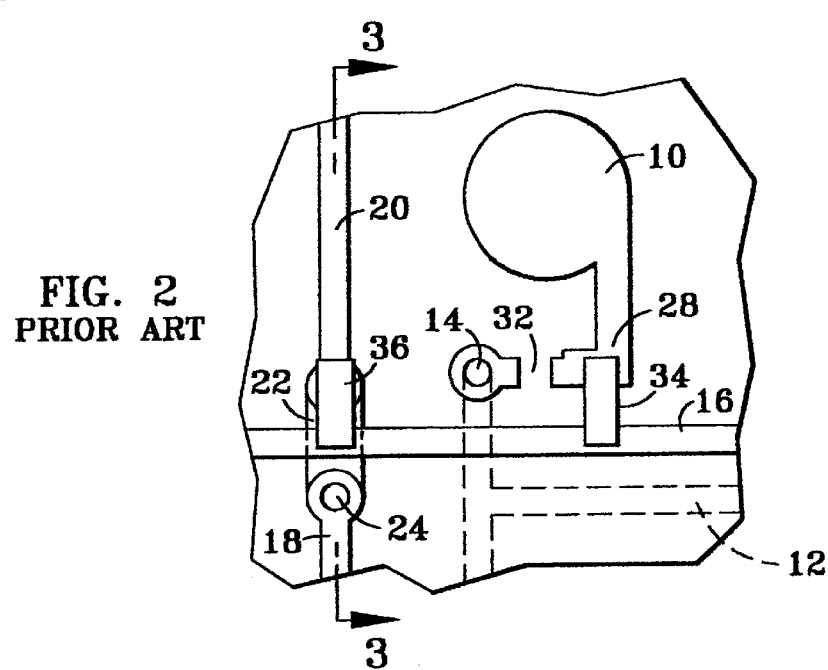
FIG. 2 is a plan view of the portion of the device shown in FIG. 1 after the conventional repair process.
Figure 3:
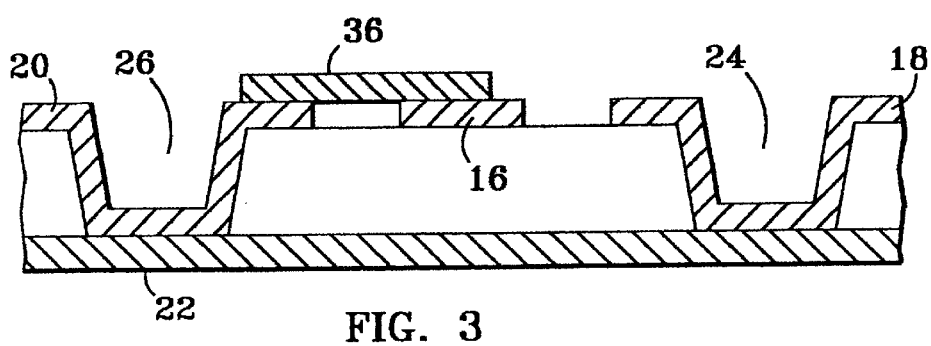
FIG. 3 is a cross-sectional view taken along the line 3—3 of FIG. 2.
Figure 4A:
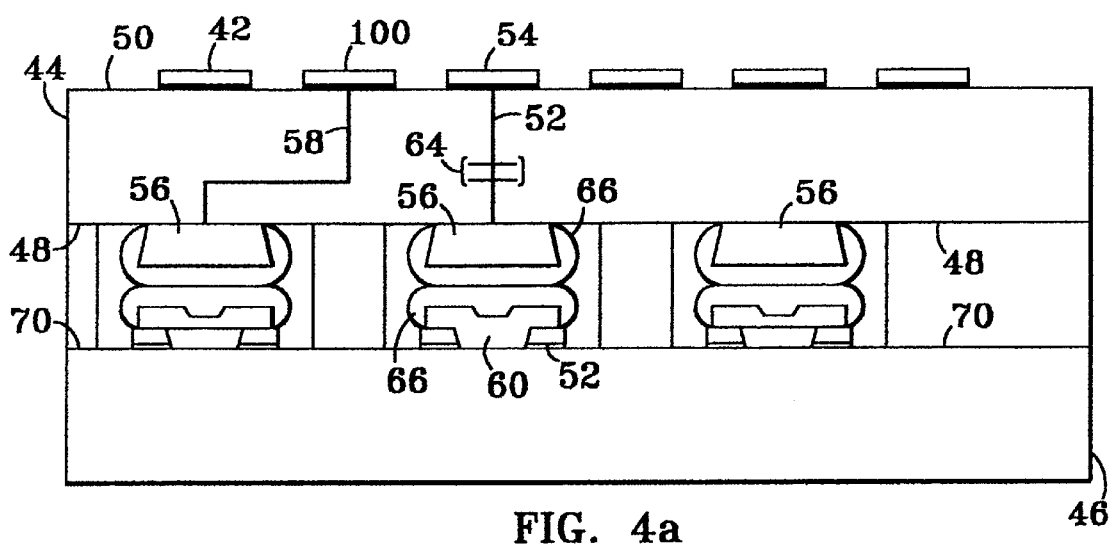
FIG. 4(a) is a cross-sectional view showing the I/O net and a z-repair line according to the invention.

Referring now to the drawings, where like elements receive like reference numerals throughout, in the proposed TFTJ process, the thin film structure 40 is built with the top surface metallurgy 42 up on a glass carrier (not shown), as shown in FIG. 4(a). After test and repair, the structure 40 is flipped over to a secondary glass carrier (not shown) to expose the bottom surface 48 (I/O) of the TF structure 40. This step is at the preparation step prior to joining the TF to a ceramic carrier 46. However, since both top and bottom surfaces 48, 50 of TF are now accessible due to this flip-flop approach, repair of the I/O nets is possible in this TSM up TFTJ process.

The repair methodology proceeds as follows for a defective net 52. (This repair process is preferably repeated for each defective net 52.) A defective I/O net 52 is identified for repair using conventional test or inspection techniques, with both the C4 54 and the solder joining pad 56 and mating pad 60 locations of the net 52 already established. Any constraints associated with the I/O net 52 are understood, e.g. minimum and maximum lengths, net topography, etc. A spare C4 / capture pad z-repair path 58 is chosen from those available in the design. They are chosen based on the wiring rules established to insure electrical functionality and equivalence. This can be optimized by relying on graphically assisted wiring tools or through an automated routing system generally known in the art.

The defective portion 64 of the I/O net 52 is then disconnected at the C4 54 by cutting of the delete strap on the top surface (not shown). The C4 54 is wired to the spare z-repair 58 chosen in the previous step by way of C4 100, again insuring compliance with the wiring rules. This rewiring is done using conventional repair methodologies (e.g., spot expose, LSR shunt add, etc.). The spare capture pad 102 is wired to the capture pad 60 of the defective net 52 using the repair paths available, again insuring compliance with the wiring rules. This is done using conventional repair methodologies, as described above. The solder connection 66 from the defective net 52 capture pad 60 is then eliminated. The ceramic 46 and thin film 44 are joined standard, completing the repair, and the structure is tested to insure electrical functionality. FIG. 4 illustrates the completed TFTJ structure after repair. (Note: The chip to chip C4 connections are not shown in this representation).

Figure 4B:
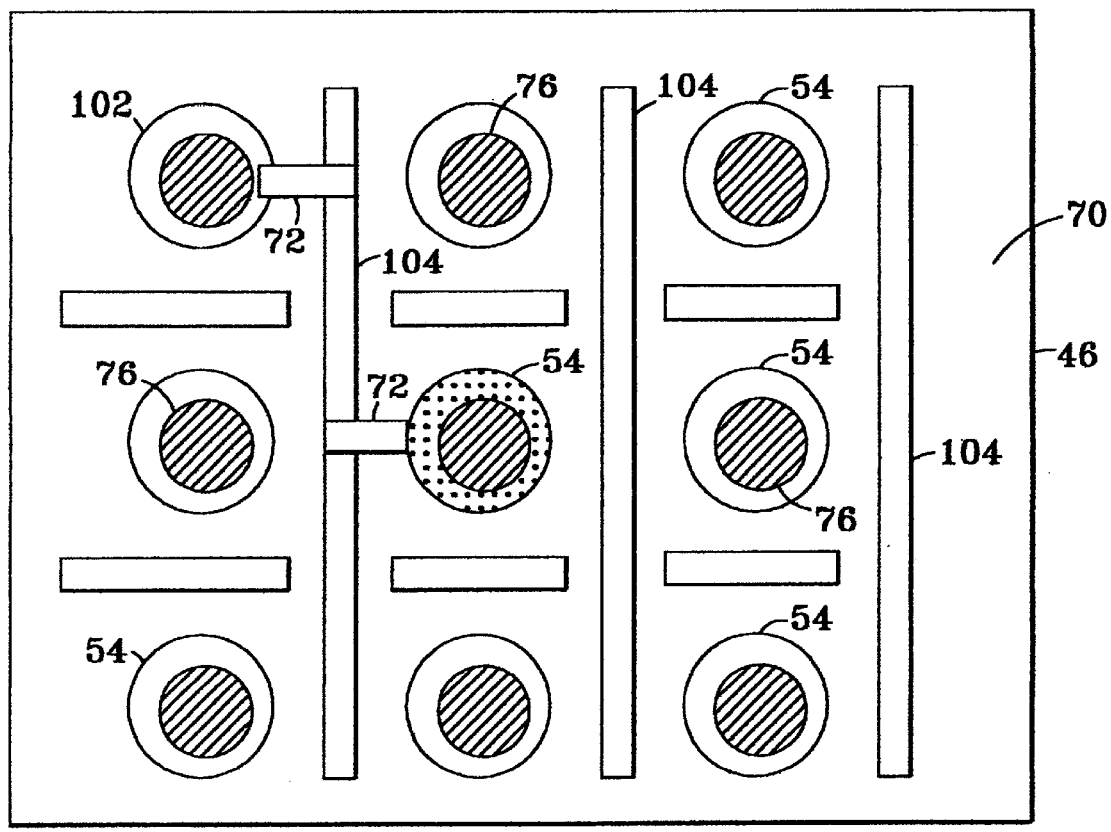
FIG. 4(b) is a top view of the C/P joining surface of the ceramic.
Figure 4C:
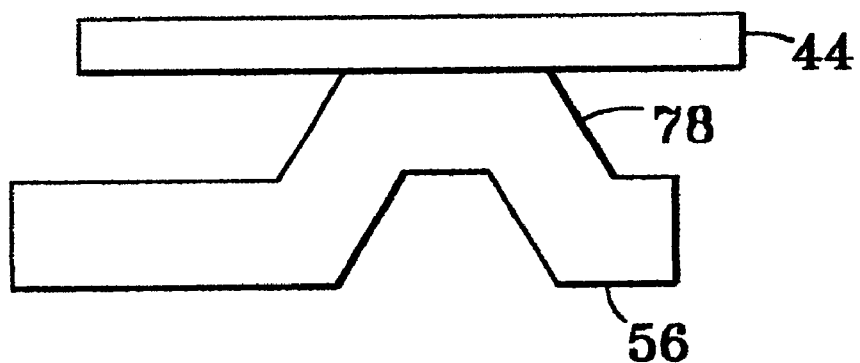
FIG. 4(c) is a cross-sectional blow-up of a capture pad.
Figure 4D:
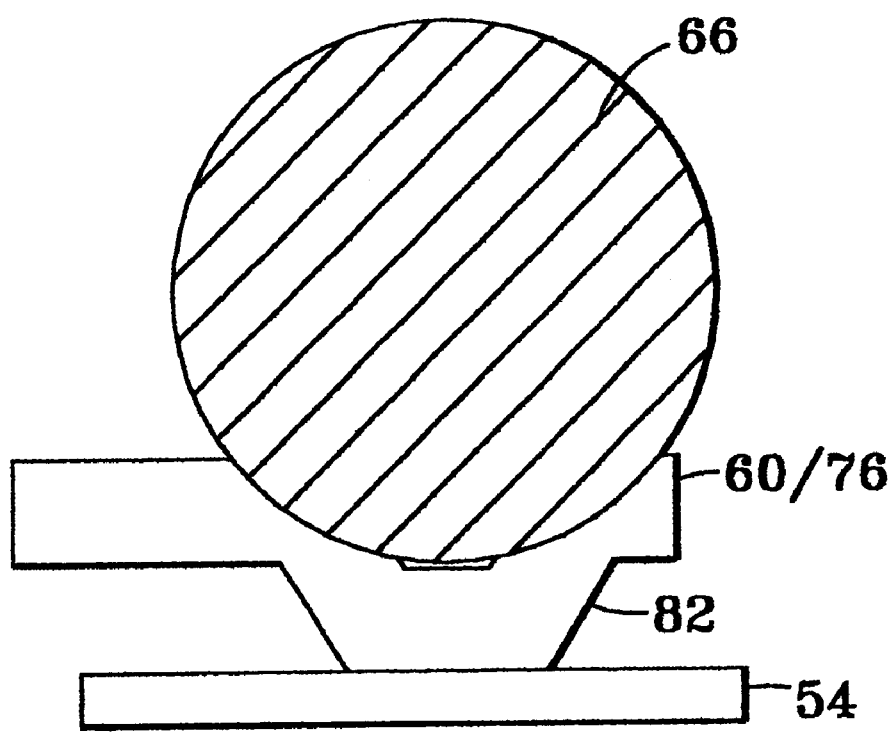
FIG. 4(d) is a cross-sectional blow-up of a via.

FIG. 4(b) is a top plan view of the surface 70 of the ceramic 46 to which the thin film transfer body 44 is joined. It is on this surface 70 that the alternative wiring path structures 104 are placed to permit the rerouting of defective I/O nets 52. Also shown are the connections 72 from defective I/O net 52 (FIG. 4(a)) to the spare capture pad 102 of the z-repair line 58 (FIG. 4(a)) in the C/P plane. The dark circles 76 shown in FIG. 4(b) represent the capture pads 60, and preferably comprise nickel-gold BLM (Ball Limiting Metallurgy) with solder. The larger circles 54 preferably are Cr/Cu/Cr and represent capture pads 60 that are used to buffer stress to the ceramic 46 as well as to provide lands for repair bonds.

As can be seen, the invention provides for the creation of alternative wiring paths between C4's 54 and the bottom surface 48 of the thin film portion 42 of the structure 40 (spare vertical connections). Since the presence of alternative wiring can create congestion that could impact the wiring of the module, these spare features are better designed after the initial wiring of the thin film 42 is complete. In this way, clear areas, spare C4's 100 and spare capture pads 102 can be easily identified and connected. Numerous connections can be established according to this technique, especially in I/O intensive areas, to permit multiple wiring paths.

The creation of a simple wiring pattern of X and Y lines on the surface of the ceramic substrate 46 is also provided to which the thin film transfer 42 will be mated. This consists of lines 104 with areas that would facilitate joining of discrete bonds to make new connections. These areas are functionally similar to the structures used on the top surface 50 of the thin films 42 for standard net repair. It is also feasible to alternatively have these wiring patterns on the underside 48 of the thin film transfer 42 instead of on the ceramic 46 surface. The ceramic 46 side wiring could be in one level or in multiple levels, depending on the requirements of the substrate. The preferred structure is to have the repair paths on the ceramic 46—this simplifies the processing and gives improved cycle times by keeping more of the processing in parallel.

A method is also provided to remove or block the solder ball connection 66 from the defective net 52 during the joining of the thin film 42 to the ceramic 46 using a solder lamination process. This is preferably achieved by removal of the ball 66, elimination of the via 78 (see FIG. 4(c)) between the underside 48 of the thin film 42 and the solder pad 56 on the thin film side, elimination of the via 82 (see FIG. 4(d)) between the ceramic 46 and the solder joining 76 on the ceramic side, or other such methods generally known in the art.

It is to be understood that a wide range of changes and modifications to the embodiments described above will be apparent to those skilled in the art and are contemplated. It is therefore intended that the foregoing detailed description be regarded as illustrative, rather than limiting, and that it be understood that it is the following claims, including all equivalents, that are intended to define the spirit and scope of the invention.

What is claimed is:

1. A method for top-to-bottom I/O net repair in a thin film transfer and join process, comprising the steps of:

providing a C4 location and a capture pad on a thin film CHIP CARRIER;

identifying a defective net on the thin film WIRING and the associated C4 location;

disconnecting the C4 location associated with the defective net;

identifying a spare C4 location and corresponding capture pad to provide a z-repair line in the thin film; and rewiring the defective net to the z-repair line to match the functionality of a non-defective net.

2. The method defined in claim 1, further comprising the step of identifying the defective net through conventional test or inspection techniques.

3. The method defined in claim 1, further comprising the step of providing a plurality of C4 locations and capture pads.

4. The method defined in claim 1, further comprising the step of disconnecting the defective net at the C4 location by cutting a delete strap.

5. The method defined in claim 1, wherein the rewiring step comprises conventional repair methodologies.

6. The method defined in claim 1, further comprising the step of eliminating a solder connection between the defective net and the associated capture pad.

7. The method defined in claim 6, wherein the step of eliminating the solder connection comprises removal of a solder ball.

8. The method defined in claim 6, wherein the step of eliminating the solder connection comprises elimination of a via connecting a solder pad to a substrate or thin film.

9. The method defined in claim 6, wherein the step of eliminating the solder connection comprises blocking of a solder pad with insulating material to prevent solder joining.

10. A top-to-bottom I/O net repair structure in a thin film transfer and join process, comprising:

a thin film transfer disposed on a ceramic substrate;

a C4 location and a capture pad disposed on the thin film ceramic substrate;

a defective net having an associated C4 location and capture pad;

a spare C4 location and corresponding capture pad coupled to provide a z-repair line in the thin film ceramic substrate;

an open circuit connection between the defective net and the associated C4 location; and a connection between the capture pad of the defective net and that of the spare Z repair line.

11. The structure defined in claim 10, wherein the capture pad comprises a chromium copper composite.

12. The structure defined in claim 10, wherein the solder joining surfaces comprises nickel or nickel-gold composites.

13. The structure defined in claim 10, wherein the C4 location comprises plural C4 locations.

14. The structure defined in claim 10, wherein the capture pad comprises plural capture pads.

15. The structure defined in claim 10, further comprising a delete strap coupled to the defective net.

16. The structure defined in claim 10, further comprising a solderless connection between the defective net and the associated capture pad.

* * * * *